(12) United States Patent
Bhatia et al.

(10) Patent No.: US 9,311,967 B2
(45) Date of Patent: Apr. 12, 2016

(54) CONFIGURABLE VOLTAGE REDUCTION FOR REGISTER FILE

(71) Applicant: Apple Inc., Cupertino, CA (US)

(72) Inventors: Ajay Kumar Bhatia, Saratoga, CA (US); Anshul Y. Mehta, San Jose, CA (US); Amrinder S. Barn, San Jose, CA (US); Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 85 days.

(21) Appl. No.: 14/291,582

(22) Filed: May 30, 2014

(65) Prior Publication Data

US 2015/0348600 A1    Dec. 3, 2015

(51) Int. Cl.
| | | |
|---|---|---|
| *G11C 5/14* | (2006.01) | |
| *G11C 7/00* | (2006.01) | |
| *G11C 29/02* | (2006.01) | |
| *G11C 29/52* | (2006.01) | |
| G11C 29/04 | (2006.01) | |
| G11C 29/44 | (2006.01) | |

(52) U.S. Cl.
CPC ............. *G11C 5/147* (2013.01); *G11C 29/021* (2013.01); *G11C 29/028* (2013.01); *G11C 29/52* (2013.01); *G11C 2029/0409* (2013.01); *G11C 2029/4402* (2013.01)

(58) Field of Classification Search
CPC ......... G11C 5/14; G11C 5/147; G11C 7/1078
USPC ............................................. 365/226, 189.16
See application file for complete search history.

(56) References Cited

U.S. PATENT DOCUMENTS

| | | | |
|---|---|---|---|
| 7,466,604 B2 | 12/2008 | Ellis et al. | |
| 2010/0277990 A1* | 11/2010 | Kenkare ................. | G11C 5/147 365/189.011 |
| 2013/0077387 A1 | 3/2013 | Yabuuchi | |
| 2014/0003181 A1 | 1/2014 | Wang et al. | |
| 2014/0112429 A1* | 4/2014 | Bhatia ..................... | G11C 19/28 377/67 |

* cited by examiner

*Primary Examiner* — Haoi V Ho
*Assistant Examiner* — Tri Hoang
(74) *Attorney, Agent, or Firm* — Meyertons, Hood, Kivlin, Kowert & Goetzel, P.C.

(57) ABSTRACT

A system, a memory device and a method are contemplated in which the apparatus may include a plurality of memory cells, a plurality of voltage reduction circuits, and control circuitry. The plurality of voltage reduction circuits may be configured to reduce a voltage level of a power supply coupled to the plurality of memory cells. The control circuitry may be configured to select one of the voltage reduction circuits based on one or more operating parameters. The control circuitry may be further configured to activate the selected voltage reduction circuit upon receiving a write command directed towards the memory cells. The control circuitry may be further configured to execute the write command. Upon completion of the write command, the control circuitry may be further configured to de-activate the selected one of the voltage reduction circuits.

20 Claims, 7 Drawing Sheets

| float_en 610 | phase 614 | float1 612 | float0 613 | float duration |
|---|---|---|---|---|
| 0 | 0 | x | x | continuous |
| 1 | 0 | x | x | write phase |
| 1 | 1 | x | 0 | 3 gate delays |
| 1 | 1 | 0 | 1 | 5 gate delays |
| 1 | 1 | 1 | 1 | 7 gate delays |

CONFIGURABLE VOLTAGE REDUCTION FOR REGISTER FILE

BACKGROUND

1. Technical Field

Embodiments described herein are related to the field of integrated circuit implementation, and more particularly to the implementation of memory power management.

2. Description of the Related Art

Semiconductor manufacturing technologies continue to reduce scale allowing for smaller geometries and feature sizes, and System-on-a-Chip (SoC) designs utilize these newer technologies to increase performance and/or reduce power consumption. These scaled technologies, however, present some design challenges. One challenge may be reliable operation of memory cells.

Static memory cells operate by latching a state, commonly referred to as a "1" or "0" or as a "high" or "low" within a small circuit. A memory cell may actually store two values, one representing the data value stored in the memory cell and the other value being the opposite of the data value, i.e., the inverse of the data value. A write to a memory cell that changes the data value may require forcing the stored values to opposite states. In other words, to change a memory cell from a high to a low, the data value currently in a high state may be driven to a low state and the inverse data value currently in a low state may be driven high. For the write operation to be successful, the driven values must force the circuit of the memory cell to swap states, thereby storing the low value in the data value and the high value in the inverse data value.

As semiconductor technologies shrink, the ability to write to memory cells and force the states to swap becomes more difficult. A method of improving the reliability of writing to memory cells created in the smaller geometries is desired.

SUMMARY OF THE EMBODIMENTS

Various embodiments of a memory are disclosed. Broadly speaking, a system, an apparatus and a method are contemplated in which the apparatus may include a plurality of data storage cells, a plurality of voltage reduction circuits, and control circuitry. Each of plurality of voltage reduction circuits may be configured to reduce a voltage level of a power supply coupled to the plurality of data storage cells. The control circuitry may be configured to select one of the plurality of voltage reduction circuits based on one or more operating parameters. The control circuitry may be further configured to activate the selected voltage reduction circuit upon receiving a write command for one or more of the plurality of data storage cells. The control circuitry may be further configured to execute the write command. Upon completion of the execution of the write command, the control circuitry may be further configured to de-activate the active one of the voltage reduction circuits.

In a further embodiment, the plurality of voltage reduction circuits may include a first voltage reduction circuit including a first transistor coupled between the power supply and a power terminal on each of the plurality of data storage cells, wherein a voltage level of a first control signal coupled to the first transistor is less than a threshold voltage of the first transistor. The plurality of voltage reduction circuits may also include a second voltage reduction circuit including a second transistor coupled to the power supply and an intermediate node and a third transistor coupled between the intermediate node and a power terminal on each of the plurality of data storage cells, wherein a control terminal of the second transistor may be coupled to a ground reference and a control terminal of the third transistor may be coupled to a second control signal. Additionally, the plurality of voltage reduction circuits may include a third voltage reduction circuit configured to decouple the power supply from the power terminal on each data storage cell of the plurality of data storage cells for a duration of the write operation.

In another embodiment, the circuitry may be further configured to detect and track data errors associated with the execution of the write operation. In a further embodiment, one of the one or more operating parameters may be dependent upon the tracked data errors.

In a given embodiment, one of the one or more operating parameters may be dependent upon a level of activity of additional circuitry adjacent to the plurality of data storage cells. In one embodiment, one of the one or more operating parameters may be dependent upon a detected temperature. In another embodiment, one of the one or more operating parameters may be dependent upon the one or more data storage cells of the plurality of data storage cells.

BRIEF DESCRIPTION OF THE DRAWINGS

The following detailed description makes reference to the accompanying drawings, which are now briefly described.

Figure 1:
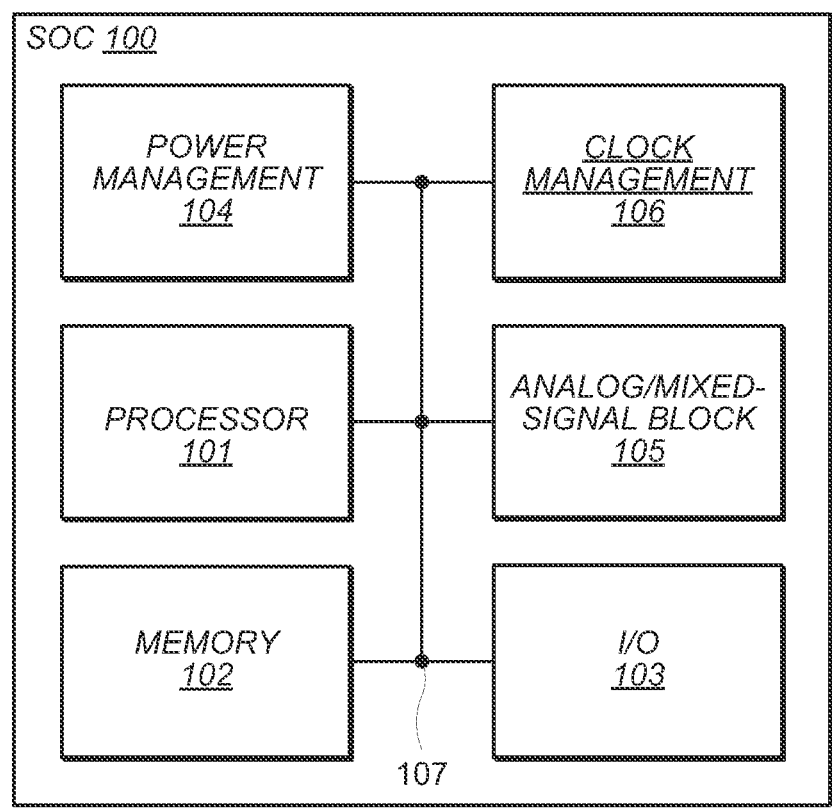
FIG. 1 illustrates a block diagram of an embodiment of a system-on-a-chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/ components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Semiconductor manufacturing technologies continue to scale down to smaller feature sizes, driven by a demand from consumers for lower costs, higher performance and longer battery life. SoC designs may utilize these newer technologies in an attempt to meet these demands. The use of such technologies does, however, present design challenges. A particular area of concern is the reliable operation of memory cells.

Many terms commonly used in reference to SoC designs are used in this disclosure. For the sake of clarity, the intended definitions of some of these terms, unless stated otherwise, are as follows.

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

The embodiments illustrated and described herein may employ CMOS circuits. In various other embodiments, however, other suitable technologies may be employed.

As stated above, a write to a memory cell that changes the data value may require forcing the stored values to opposite states. For the write operation to be successful, a driven low value must force a high level in the circuit of the memory cell to swap states to a low level. In older CMOS technologies, n-channel transistors tended to pull a given node to ground with more strength than a p-channel transistor could pull the same node to a high level, making this state swap easier. The shift to smaller CMOS technologies has caused some CMOS manufacturing processes to generate more equal re-channel and p-channel transistors, thereby making the state swap in the memory cell more difficult. One method of improving the reliability of writing to memory cells is to lower or "weaken" the power supplied to the memory cell itself, thereby making the driven low values stronger than the stored high values. This may result in more successful writes to memory cells.

A reliable system and method for improving the reliability of data writes to memory cells is desired. Several circuits for reducing or weakening memory cell power supplies for data writes and a method for selecting from the multiple voltage reduction circuits are presented herein. A method for tracking performance of the selected voltage reduction circuit is also presented.

System-on-a-Chip Overview

A block diagram of an embodiment of an SoC is illustrated in FIG. 1. In the illustrated embodiment, the SoC 100 includes a processor 101 coupled to memory block 102, I/O block 103, power management unit 104, analog/mixed-signal block 105, and clock management unit 106, all coupled through bus 107. In various embodiments, SoC 100 may be configured for use in a mobile computing application such as, e.g., a tablet computer or cellular telephone.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores and may include one or more register files and memories.

In various embodiments, processor 101 may implement any suitable instruction set architecture (ISA), such as, e.g., PowerPC™, or x86 ISAs, or combinations thereof, as well as other ISAs. Processor 101 may include one or more bus transceiver units that allow processor 101 to communication to other functional blocks within SoC 100 such as, memory block 102, for example.

Memory block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), or a Magnetoresistive Random Access Memory (MRAM), for example. Some embodiments may include a single memory, such as memory block 102 and other embodiments may include more than two memory blocks (not shown). In some embodiments, memory block 102 may be configured to store program instructions that may be executed by processor 101. Memory block 102 may, in other embodiments, be configured to store data to be processed, such as graphics data, for example.

I/O block 103 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 103 may be configured to implement a version of Universal Serial Bus (USB) protocol or IEEE 1394 (Firewire®) protocol, and may allow for program code and/or program instructions to be transferred from a peripheral storage device for execution by processor 101. In one embodiment, I/O block 103 may be configured to perform the data processing necessary to implement an Ethernet (IEEE 802.3) networking standard.

Power management unit 104 may be configured to manage power delivery to some or all of the functional blocks included in SoC 100. Power management unit 104 may comprise sub-blocks for managing multiple power supplies for various functional blocks. In various embodiments, the power supplies circuits may be located in analog/mixed-signal block 105, in power management unit 104, in other blocks within SoC 100, or come from external to SoC 100, coupled through power supply pins. Power management unit 104 may include one or more voltage regulators to adjust outputs of the power supply circuits to various voltage levels as required by functional blocks within SoC 100.

Analog/mixed-signal block 105 may include a variety of circuits including, for example, a crystal oscillator, a phase-locked loop (PLL) or frequency-locked loop (FLL), an analog-to-digital converter (ADC), and a digital-to-analog converter (DAC) (all not shown). Analog/mixed-signal block 105 may also include, in some embodiments, radio frequency (RF) circuits that may be configured for operation with cellular telephone networks. Analog/mixed-signal block 105 may include one or more voltage regulators to supply one or more voltages to various functional blocks and circuits within those blocks.

Clock management unit 106 may be configured to select one or more clock sources for the functional blocks in SoC 100. In various embodiments, the clock sources may be located in analog/mixed-signal block 105, in clock management unit 106, in other blocks with SoC 100, or come from external to SoC 100, coupled through one or more I/O pins. In some embodiments, clock management 106 may be capable of dividing a frequency of a selected clock source before it is distributed throughout SoC 100. Clock management unit 106 may include registers for selecting an output frequency of a PLL, FLL, or other type of adjustable clock source. In such embodiments, clock management unit 106 may manage the configuration of one or more adjustable clock sources, and may be capable of changing clock output frequencies in stages in order to avoid a large change in frequency in a short period of time.

System bus 107 may be configured as one or more buses to couple processor 101 to the other functional blocks within the SoC 100 such as, e.g., memory block 102, and I/O block 103. In some embodiments, system bus 107 may include interfaces coupled to one or more of the functional blocks that allow a particular functional block to communicate through the bus. In some embodiments, system bus 107 may allow movement of data and transactions (i.e., requests and responses) between functional blocks without intervention from processor 101. For example, data received through the I/O block 103 may be stored directly to memory block 102.

It is noted that the SoC illustrated in FIG. 1 is merely an example. In other embodiments, different functional blocks and different configurations of functional blocks may be possible dependent upon the specific application for which the SoC is intended. It is further noted that the various functional blocks illustrated in SoC 100 may operate at different clock frequencies.

Figure 2:
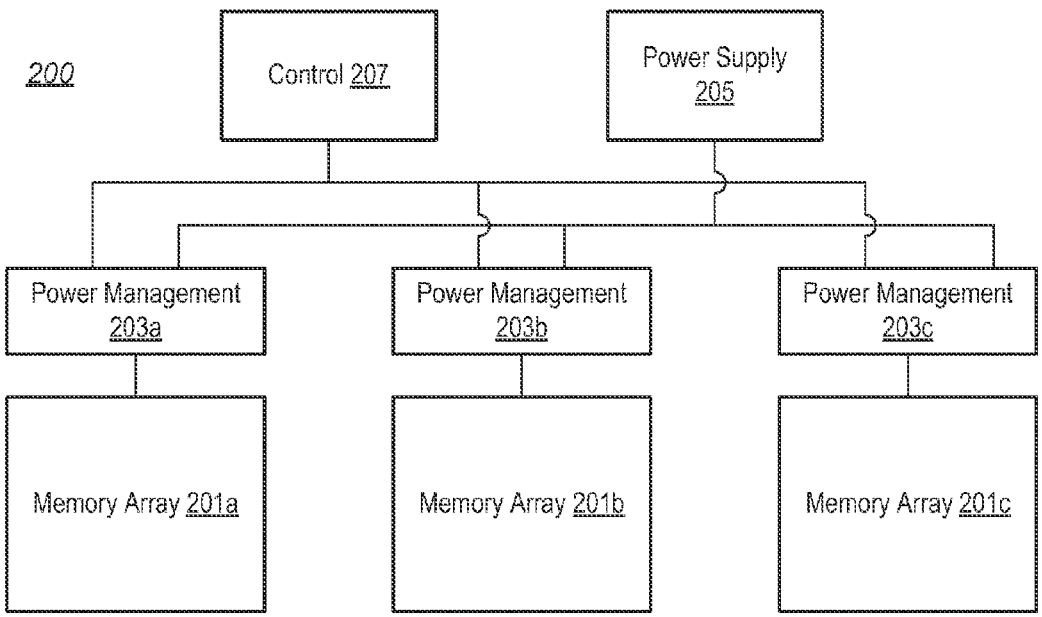
FIG. 2 illustrates a block diagram of an embodiment of a memory system.

Turning to FIG. 2, an embodiment of a memory system is illustrated. FIG. 2 illustrates a memory according to one of several possible embodiments and may be included in an SoC such as, e.g., SoC 100 as illustrated in FIG. 1. In the illustrated embodiment, memory 200 includes memory arrays 201a-201c, power management circuits 203a-203c, power supply 205, and control logic 207.

Memory arrays 201 may each include a plurality of memory cells. Memory arrays 201 may correspond to memory included in memory block 102 in FIG. 1 or may correspond to various other types of memory included in other functional blocks of SoC 100 in FIG. 1, such as, for example, cache memory or register files in processor 101, or register files or data buffers in I/O block 103. Memory arrays 201 may consist of any suitable type of memory cells as described above in respect to memory block 102. Each memory array 201 may be coupled to a respective power management circuit 203.

Power management circuits 203 may each include a plurality of voltage adjustment circuits. Within a given power management circuit 203, each voltage adjustment circuit may be configured to adjust a voltage level using a different respective technique. Power management circuits 203 may be used to adjust a voltage level supplied by power supply 205 to memory arrays 201. Power supply 205 may derive from any suitable power source available in SoC 100 and may be a power source local to memory arrays 201 or may be provided from a power bus routed throughout SoC 100.

The voltage level of power supply 205 may be adjusted by power management circuits 203 during a memory operation to memory cells of a given memory array 201. In some embodiments, during a write operation for example, adjusting the voltage level of power supply 205 may result in more memory cells being successfully written. Each power management circuit 203 may only adjust the voltage level at the corresponding memory array 201 and not affect the voltage level of power supply 205 at other memory arrays 201. Power management 203a, for example, may only adjust the voltage level at memory array 201a and so forth.

Control logic 207 may control which type of voltage adjustment circuit of the plurality of voltage adjustment circuits included in a given power management circuit 203 is selected when a memory operation is executed on the respective memory array 201. In some embodiments, control logic 207 may continuously or periodically select a given one of the voltage adjustment circuits. The selected circuit may not be activated until a memory command has been received for the respective memory array 201. In other embodiments, control logic 207 may wait to select a type of voltage adjustment circuit until the memory command has been received, at which point, control logic 207 may then select and activate a given one of the plurality of voltage adjustment circuits.

To select a voltage adjustment circuit, control logic 207 may depend on one or more operating parameters or characteristics. Operating parameters may include, in various embodiments, a current voltage level of power supply 205, a type of power supply coupled to SoC 100 (such as a battery versus a charger), a measure of activity of circuits adjacent to a given memory array 201 and/or near the respective power management 203, a measure of a noise floor sensed on an output of power supply 205 or a ground reference coupled to the given memory array 201, or a temperature measured either on SoC 100 or within an enclosure of a system including SoC 100.

Control logic 207 may also detect data errors from each write operation for each of the plurality of voltage adjustment circuits. After a given write operation, control logic 207 may verify the value stored in the just written memory cells versus the data received from the write operation. Upon detecting a data error, control logic 207 may increment a counter corresponding to the voltage adjustment circuit used during the execution of the write operation. In some embodiments, the counters may be reset after a number of write operations without data errors. In other embodiments, another counter may be used to track a total number of write operations for each voltage adjustment circuit in addition to tracking the number of data errors. The tracked data error rates may be used as a parameter for choosing a given voltage adjustment circuit at the next selection step.

During the course of executing memory operations, control logic 207 may dynamically select a different type of voltage adjustment circuit for each power management circuit. The operating parameters used to select a given voltage adjustment circuit may be different for each memory array 201, since, for example, memory array 201a may not be adjacent to memory array 201b and parameters such as the noise level of a ground reference may be different between the two memory arrays. For example, control logic 207 may select a first type of voltage adjustment circuit for power management circuit 203a based on one or more of the operating parameters listed above and then choose a second type of voltage adjustment circuit for power management circuit 203b due to a difference in a localized operating parameter such as the activity of adjacent circuits. Data error rates may be different for the same type of voltage adjustment circuit in power management circuit 203a versus power management circuit 203b due to differences in noise thresholds, voltage levels, or even process variations from one area of SoC 100 to another.

It is noted that the embodiment of memory 200 as illustrated in FIG. 2 is merely an example. The numbers and types of functional blocks may differ in various embodiments. For example, in other embodiments, more than three memory arrays may be included and memory arrays may be located in various areas of SoC 100.

Figure 3:
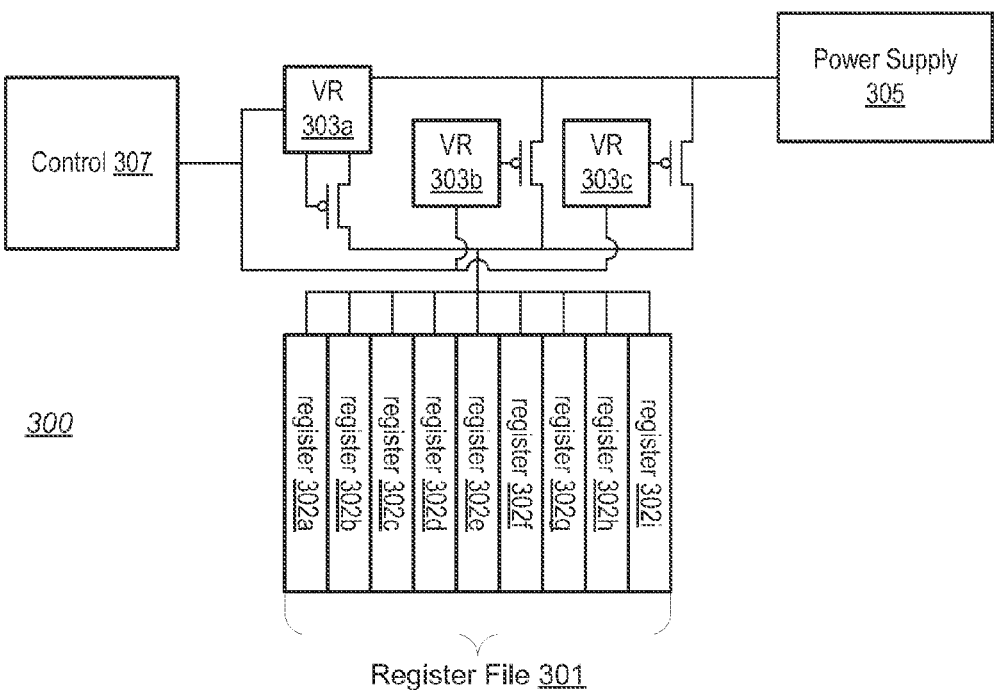
FIG. 3 illustrates another block diagram of an embodiment of a memory system.

Turning to FIG. 3, another embodiment of a memory system is illustrated. Memory system 300 of FIG. 3 may be included in one or more functional blocks of an SoC such as SoC 100 in FIG. 1. The illustrated embodiment of memory system 300 may include register file 301, voltage reduction circuits 303a-303c, power supply 305 and control circuit 307.

Register file 301 may include a number of register memories 302a-302i. Nine register memories are illustrated in FIG. 3, although, any suitable number of register memories may be included in register file 301. Also, a single register file 301 is shown, but any number of register files is contemplated. In some embodiments, register memories 302a-302i may include volatile memory cells and in other embodiments may include non-volatile memory cells. Register file 301 may be included in memory block 102 and/or in other functional blocks of SoC 100.

Voltage reduction circuits 303 may provide various voltage level adjustments to supply signals from power supply 305 to be supplied to one or more register memories 302 during a given memory operation. Each voltage reduction circuit 303 may consist of a different circuit from the other voltage reduction circuits. The performance of each voltage reduction circuit 303 may differ under various operating conditions and, therefore, one voltage reduction circuit 303 may have a more desirable performance under one set of operating conditions whereas the other voltage reduction circuits 303 may have more desirable performance under other operating conditions. A desirable performance may relate to creating additional write margin for the register memories 302 such that write errors may be reduced.

Voltage reduction circuits 303 may be characterized during a test procedure to determine which circuit performs best under various operating conditions. Operating conditions may include current operating voltage level, current operating temperature of SoC 100, an activity level of circuits adjacent to register file 301, and a noise level coupled on to a ground reference or power supply. After the test procedure, a given voltage reduction circuit 303 may be selected as a default for one or more sets of operating conditions. In some embodiments, one voltage reduction circuit 303 may be selected as a default for all operating conditions or in other embodiments, each set of conditions may be assigned a default voltage reduction circuit 303. The test procedure may be performed as part of a system test of a device including SoC 100. In other embodiments, the test procedure may be performed as part of a production unit test of SoC 100 before it is included into a system. In still other embodiments, one or more examples of SoC 100 may be tested as part of device characterization and the results from the one or more examples may be used to select defaults for a group of SoCs.

Control circuit 307 may control the selection of a given one of voltage reduction circuits 303. Control circuit 307 may select the given voltage reduction circuit 303 at predetermined intervals or responsive to one or more events. One or more operational conditions may be considered as part of the selection process. In some embodiments, the given one of the voltage reduction circuits may be activated when a memory operation is directed towards one or more register memories 302. In other embodiments, the given one of the voltage reduction circuits may be selected and activated in response to a memory operation is directed towards one or more register memories 302.

The operating conditions used for the selection of the given voltage reduction circuit 303 may be similar to those described above in reference to control logic 207 in FIG. 2. Control circuit 307 may also detect and track data errors similar to control logic 207.

A selected voltage reduction circuit 303 may be used to reduce the voltage level of power supply 305 during a memory operation on register file 301, such as a write command for register memory 302e, for example. A reduced voltage level on the power signal from power supply 305 may help register memory 302e to store the written data successfully.

It is noted that the embodiment illustrated in FIG. 3 is merely an example. In other embodiments, a different number of voltage reduction circuits or a different number of register memories 302 may be included. Additionally, multiple sets of register files and voltage reduction circuits may be included.

Figure 4:
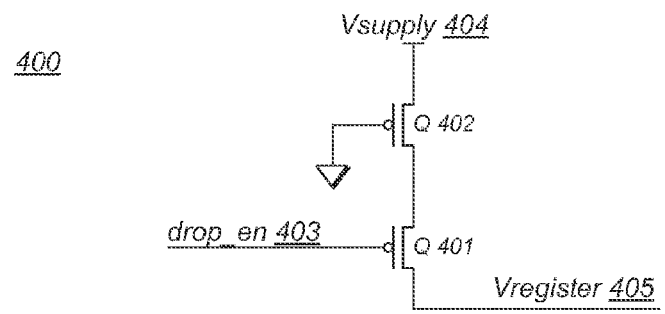
FIG. 4 illustrates an embodiment of a first voltage reduction circuit.

Moving now to FIG. 4, an embodiment of a first voltage adjustment circuit is illustrated. Voltage adjustment circuit 400 may, in some embodiments, correspond to voltage reduction circuit 303a in FIG. 3. Voltage adjustment circuit 400 includes transistor Q401 coupled to transistor Q402, receives inputs drop_en 403 and Vsupply 404, and outputs signal Vregister 405. Vregister 405 may be a power supply signal for one or more register memories, such as register memories 302 in FIG. 3. It is noted that, in various embodiments, a "transistor" may correspond to one or more transconductance elements such as a metal-oxide-semiconductor field-effect transistor (MOSFET) or junction field-effect transistor (JFET), for example.

The control gate for Q402 may be coupled to a ground reference, resulting in Q402 conducting which may allow Vsupply 404 to pass through Q402 with a voltage drop (Vdrop1) across Q402. Q402 may function similar to a resistor and the size of Vdrop1 may depend on how Q402 is designed and fabricated. In some embodiments, Q402 may be designed such that Vdrop1 varies significantly with changes in Vsupply 404. In other embodiments, Q402 may be designed such that Vdrop1 does not vary significantly with changes in Vsupply 404.

Input signal drop_en 403 may enable and disable voltage adjustment circuit 400. When drop_en 403 is low, then Q401 conducts and Vregister 405 is coupled to the output of Q402, in other words, Vsupply−Vdrop1. An additional voltage drop (Vdrop2) may be realized across Q401 such that Vregister equals Vsupply−Vdrop1−Vdrop2. Q401 may be designed to minimize Vdrop2 such that Vdrop1>Vdrop2. Other embodiments are contemplated in which Q401 and Q402 may be designed such that Vdrop1 approximately equal to Vdrop2 or Vdrop1<Vdrop2.

When drop_en 403 is high, Q401 may be disabled and the output signal from Q401 may be high impedance. In other words, the node is not being driven to a given voltage level, in which case, the voltage level of the node is unknown when the circuit is receiving power. In some embodiments, when drop_en 403 is low, a signal from another circuit coupled to Vregister 405 may drive the node to a voltage level equal to the voltage level of Vsupply 404 or another suitable voltage level for a memory read operation or for pre-charging a memory cell before a write operation.

Input drop_en 403 may be set to enable voltage adjustment circuit 400 as a voltage reduction circuit for register file 301 during a memory access operation to one or more register memories 302. Upon completion of the memory operation, drop_en 403 may be driven low to deactivate voltage adjustment circuit 400.

It is noted that FIG. 4 is merely an example for the purposes of illustration. Other embodiments may include additional transistors, signals, as well as different configurations of transistors.

Figure 5:
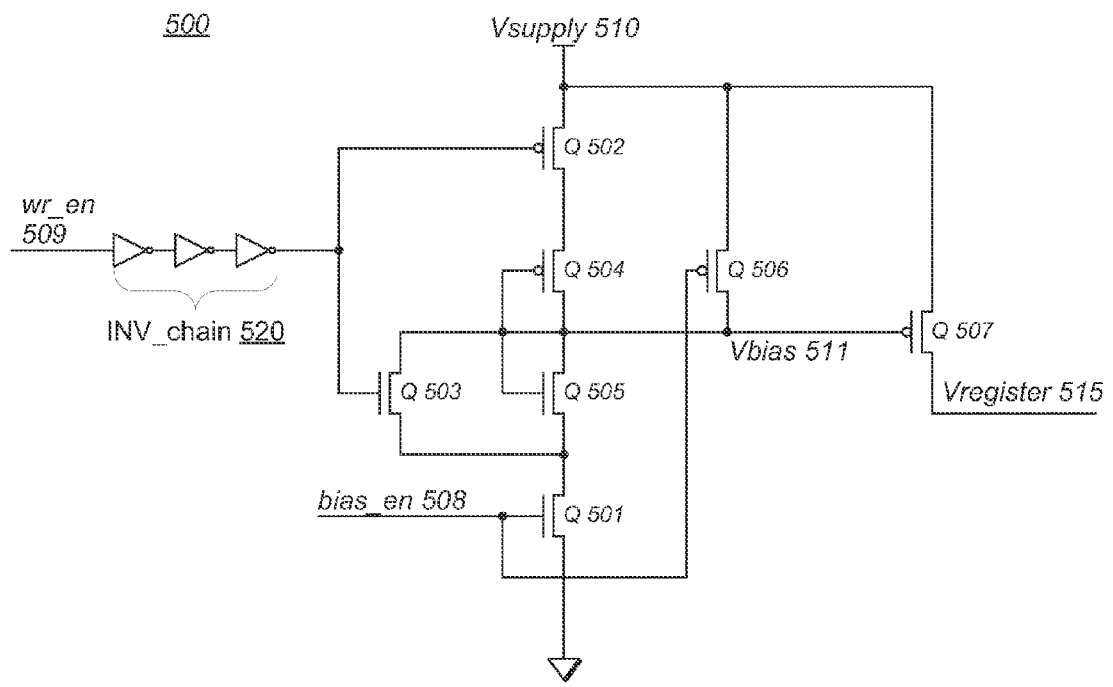
FIG. 5 illustrates an embodiment of a second voltage reduction circuit.

Turning to FIG. 5, an embodiment of a second voltage adjustment circuit is illustrated. Voltage adjustment circuit 500 may, in some embodiments, correspond to voltage reduction circuit 303b in FIG. 3. Voltage adjustment circuit 500 includes transistor Q501 coupled to transistors Q503 and Q505, transistor Q502 coupled to transistor Q504, and transistor Q506 coupled to transistors Q503, Q504, Q505 and Q507. Inverter chain 520 is coupled to Q502 and Q503. Voltage adjustment circuit 500 receives input signals bias_en 508, wr_en 509, and Vsupply 510. Vbias 511 is an intermediate signal and Vregister 515 is the output of voltage adjustment circuit 500 and may correspond to a power supply signal for one or more register memories, such as register memories 302 in FIG. 3.

Input signal bias_en 508 may control the enabling and disabling of voltage adjustment circuit 500. When bias_en 508 is low, Q501 is off and Q506 is on. Q506 allows Vsupply 510 to pull Vbias 511 high which, in turn, turns Q507 off, allowing Vregister 515 to float as described above in reference to FIG. 4.

When bias_en 508 transitions high, Q506 turns off and Q501 turns on, opening a path to ground for transistors Q503 and Q505. Q503 is controlled by the output of inverter chain 520 which inverts the state of wr_en 509. If wr_en 509 is low when bias_en 508 transitions high, the output of inverter chain 520 is high, which will turn Q502 off and Q503 on. With both Q501 and Q503 on, Vbias 511 may be pulled towards ground, which will turn Q507 on. With Q507 on, Vregister 515 will be pulled towards Vsupply 510. Also, while Vbias 511 is low, Q504 will be on and Q505 will be off.

When wr_en 509 transitions high, the output of inverter chain 520 will transition low after a delay through the chain of inverters. Q503 will turn off and Q502 will turn on. Since Q504 is already on, a path from Vsupply 510 to Vbias 511 is opened and Vbias 511 will be pulled towards Vsupply 510. As the voltage level of Vbias 511 rises, Q507 will start to turn off, creating a growing voltage drop across Q507, thereby lowering the voltage level of Vregister 515. Also as Vbias 511 rises, Q504 will start to turn off and Q505 will start to turn on, which will start to close the path from Vsupply 510 to Vbias 511 and start to open a path from Vbias 511 to ground. As Vbias 511 starts to fall towards ground, however, Q505 will start to turn off and Q504 will start to turn back on, thereby pulling Vbias 511 back towards Vsupply. Q504 and Q505 may find an equilibrium in which Vbias 511 is pulled equally towards Vsupply 510 and towards ground such that the voltage level of Vbias 511 is greater than ground and less than the voltage level of Vsupply. The voltage level of Vbias 511 may be determined by the design of transistors Q501, Q502, Q504, and Q505 and, in some embodiments, may be designed to be close to a threshold voltage of Q507. This equilibrium state of Vbias creates a bias voltage at the control gate of Q507 which may turn Q507 partially on creating a weak pull up on Vregister 515 to Vsupply 510. The voltage level of Vregister 515 may be some voltage drop (Vdrop) below Vsupply 510. The size of Vdrop may be determined by the design of Q507 as well as the voltage level of Vbias 511.

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Input bias_en 508 may be set to enable voltage adjustment circuit 500 as a voltage reduction circuit for register file 301 during a memory access operation to one or more register memories 302. Upon completion of the memory operation, bias_en 508 may be driven low to deactivate voltage adjustment circuit 500. While bias_en 508 is high, wr_en 509 may correspond to a write enable signal for writing data to the one or more register memories 302.

It is noted that the voltage reduction circuit illustrated in FIG. 5 is merely an example. Other embodiments may include additional transistors, signals, as well as different configurations of transistors. Operation of the circuit of FIG. 5 may also differ from the description due to differences in technology and fabrication of the circuits in other embodiments.

Figures 6, 6A, 6B:
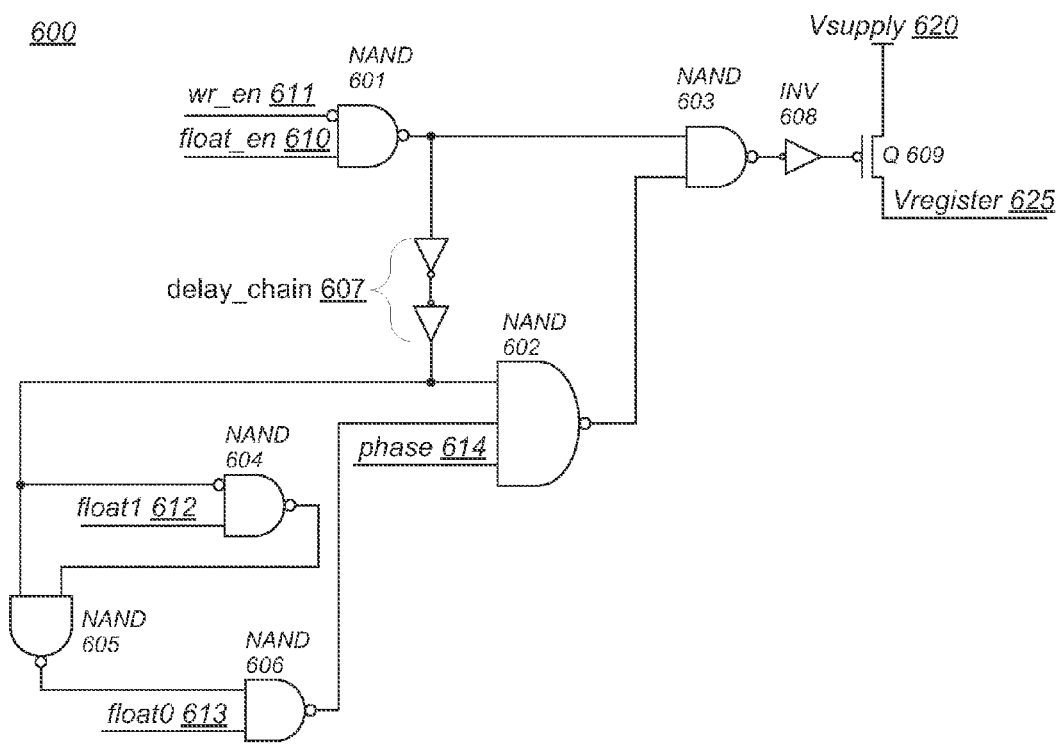
FIG. 6, which includes
FIGS. 6(a) and 6(b), illustrates an embodiment of a third voltage reduction circuit.

Moving now to FIG. 6, which includes FIGS. 6(a) and 6(b), another embodiment of a voltage adjustment circuit is illustrated in FIG. 6(a) along with a truth table for the circuit in FIG. 6(b). Voltage adjustment circuit 600 may, in some embodiments, correspond to voltage reduction circuit 303c in FIG. 3. Voltage adjustment circuit 600 includes NAND 601 coupled to NAND 603 and delay chain 607, NAND 605 coupled to NAND 604, delay chain 607 and NAND 606, and NAND 602 coupled to NAND 603, NAND 606 and delay chain 607. Inverter 608 is coupled between the output of NAND 603 and transistor Q609. Voltage adjustment circuit 600 may also receive input signals float_en 610, wr_en 611, float1 612, float0 613, phase 614, and Vsupply 620. Vregister 625 may be an output signal and may correspond to a power supply signal for one or more register memories, such as register memories 302 in FIG. 3.

Float_en 610 may be set to enable voltage adjustment circuit 600 as a voltage reduction circuit for register file 301 during a memory access operation to one or more register memories 302. Upon completion of the memory operation, float_en 610 may be driven low to deactivate voltage adjustment circuit 600. Wr_en 611 may correspond to a write enable signal for writing data to the one or more register memories 302 during a memory write operation.

Input signal float_en 610 may control the enabling and disabling of Voltage adjustment circuit 600 in conjunction with input phase 614. When float_en 610 and phase 614 are both low, the outputs of both NAND 601 and NAND 602 are high, resulting in NAND 603 output being low and inverter 608 output being high. This results in Q609 being off and Vregister 625 floating. A floating signal refers to a circuit node to which a voltage level is not applied. In other words, the node is not being driven to a given voltage level, in which case, the voltage level of the node is unknown when the circuit is receiving power.

When float_en 610 goes high, with wr_en 611 low, then NAND 601 output goes low, NAND 603 output goes high and Q609 turns on, pulling Vregister 625 towards Vsupply 620. If phase 614 is low, then NAND 602 will maintain a high output, regardless of the states of float1 612 and float0 613. When wr_en 611 goes high, the output of NAND 601 goes back to a high and the output of NAND 603 goes back to a low and Q609 turns back off, resulting in Vregister 625 floating until wr_en 611 goes back to a low, at which point Q609 will turn back on and pull Vregister 625 towards Vsupply 620 again. If wr_en 611 goes high only during the portion of a write operation in which data is being written to the memory cells, then the operation just described may float the power supply, i.e. Vregister 625, while data is being written, i.e., the write phase. Floating the power supply of the memory cell during this write phase may be one way to weaken the power supply for a memory write operation.

Changing the state of input signals phase 614, float1 612, and float0 613 may result in Vregister 625 floating for different periods of time during the high phase of wr_en 611, as shown in FIG. 6(*b*). For example, if phase 614, float0 613, and float1 612 are all high when float_en 610 is high, then while wr_en 611 is low, then the output of NAND 601 is low, making the output of NAND 603 high and thereby resulting in Q609 being on and pulling Vregister 625 to Vsupply 620. NAND 604 will be low, NAND 605 will be high, NAND 606 will be low and NAND 602 will be high.

It is noted that some logic gates, such as logic gates created in CMOS logic, may have an associated delay between a change on an input and the corresponding change in an output. This delay may be referred to as a gate delay and the delay time may be similar for a NAND gate, a NOR gate or an inverter. The following description may demonstrate the effects of gate delays.

When wr_en 611 transitions high, the output of NAND 601 goes high. Delay chain 607 may delay NAND 604 and NAND 605 from receiving the changed output of NAND 601 when NAND 603 receives the high value. Since NAND 602 is currently high, NAND 603 may transition low after receiving the high signal from NAND 601. Inverter 608 may transition high thereby turning Q609 off and floating Vregister 625. The output of delay chain 607 may transition high after two gate delays. NAND 602 may remain high since NAND 606 is still low. NAND 605 may also remain high since NAND 604 is currently low. The input to NAND 604 from delay chain 607 is inverted as denoted by the circle on the upper input to NAND 604. The inverter may be similar to other inverters in the circuit and therefore include a gate delay. The output of NAND 604 may transition high after two gate delays from the transition of the output of delay chain 607, or a total delay time of 4 gate delays from when NAND 601 transitioned.

NAND 605 may transition from high to low one gate delay after NAND 604 transitioned. This transition may result in NAND 606 transitioning high after another gate delay, or six gate delays since the transition of NAND 601. All three inputs to NAND 602 may now be high, resulting in NAND 602 transitioning low after an additional gate delay. NAND 603 may now, after a total of seven gate delays from NAND 601 transitioning high, transition from low to high, thereby turning Q609 back on and pulling Vregister 625 towards Vsupply 620.

From this example, when phase 614, float0 613, and float1 612 are all high, Vregister 625 may float for a period of time equal to seven gate delays, which may be less time than an entire write phase in which wr_en 611 is high. Other delay times may be possible with different settings of phase 614, float0 613, and float1 612 as shown in the table of FIG. 6(*b*).

It is noted that static NAND gates, such as those shown and described herein, may be a particular embodiment of a circuit designed to perform a given Boolean function, and may be implemented according to several design styles. For example, a NAND gate may be implemented as a AND gate whose output is coupled to an inverter, or a collection of transistors arranged to implement the desired Boolean function.

It is also noted that the embodiment illustrated in FIG. 6 is merely an example. In other embodiments, different numbers of gates may be used in delay chain 607 to modify the delay times. Other circuits are also contemplated in which additional NAND gates and additional inputs are used to generate more possible delay times.

Figure 7:
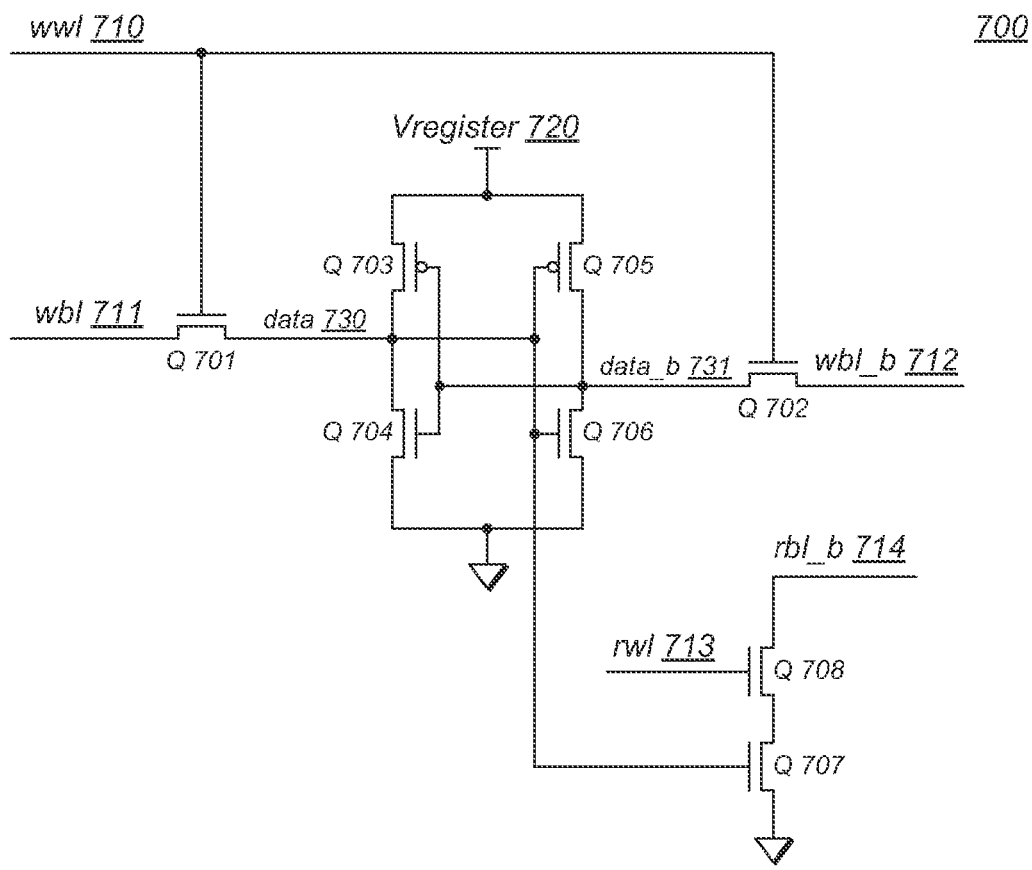
FIG. 7 illustrates an embodiment of a memory cell.

Turning to FIG. 7 an embodiment of a memory cell is illustrated. Memory cell 700 may correspond to memory cells used in register memories 302*a-i* in FIG. 3. Memory cell 700 includes transistor Q701 coupled to transistors Q703 through Q707, transistor Q702 coupled to transistors Q703 through Q706. Memory cell 700 receives inputs write word line (ww1) 710, write bit line (wb1) 711, inverse write bit line (wb1_*b*) 712, and read word line (rw1) 713. Read bit line (rb1_*b*) 714 is an output. Vregister 720 is a power source for memory cell 700 and may correspond to Vregister 405, Vregister 515, or Vregister 625 from FIG. 4, FIG. 5, and FIG. 6 respectively.

Transistors Q703 through Q706 may form cross-coupled inverters such that one bit of data may be stored on node data 730 and an inverse of the data stored on node data_b 731. To read the stored data, write word line 710 may be low, turning Q701 and Q702 off and read word line 713 may be high, turning Q708 on. Q707 may be controlled by data 730. Since data 730 is the data value stored in memory cell 700, if the data value is a "1," then data 730 will be high and Q707 will be on, thereby pulling inverse read bit line 714 low. If the data value is a "1," then data 730 will be low and Q707 will be off, leaving inverse read bit line 714 to float. In some embodiments, inverse read bit line 714 may be pre-charged high before read word line 713 goes high and therefore inverse read bit line 714 will remain high when the data value is a "0" and pulled low when the data value is a "1." In other embodiments, inverse read bit line may be coupled to a pull-up device to achieve similar results. In either embodiment, inverse read bit line 714 may be inverted as part of a final reading stage before the data is sent to the requesting block.

To write data to memory cell 700, read word line 713 may be low and write word line 710 may be high, thereby turning Q701 and Q702 on. Write bit line 711 may be coupled to data 730 and inverse write bit line 712 may be coupled to data_b 731. The data value to be written to memory cell 700 may be driven on write bit line 711 and the inverse data value may be driven on inverse word line 712. In some embodiments, only a low value may be driven on the corresponding bit line and the bit line with a high data value may be left floating. In other words, if the data to be written is a "0," write bit line 711 may be driven low and inverse write bit line 712 may be left floating. If the data value to be stored is a "1," then inverse write bit line 712 may be driven low and write bit line 711 may be left floating.

If the data value to be written is the same as the data already stored in memory cell 700, then nothing changes. For example, if data 730 is low and the new data is a "0," then write bit line 711 would also be low when Q701 turns on for the write operation and no states need to be changed. If the new data to be written is the opposite of the stored data, however, then the cross-coupled inverters of Q703 through Q706 will need to swap states. For example, if the new data is a "0" and the stored value is a "1," then when write word line 710 goes high and Q701 turns on, write bit line 711 is low and data 730 is high. The low value driven on write bit line 711 needs to pull data 730 low enough to get Q705 to turn on and Q706 to turn off. If inverse write bit line 712 is floating, then data_b 731 is determined by Q705 and Q706.

As mentioned above, as semiconductor technology shrinks, n-channel transistors and p-channel transistors may have more equal capabilities of pulling a node to a low level or high level, respectively. Writing a new value to a memory cell may require pulling a node from a high value to a low value through an n-channel transistor, while a p-channel is still pulling the node high. To improve the ability to write to the memory cells, the power supply to the memory cell may be weakened during the write phase, i.e., when the write word line is high.

Continuing with the example, Vregister 720 may be coupled to a voltage adjustment circuit such as, for example, any of the three circuits previously discussed. Coupling Vregister 720 to a voltage reduction circuit may reduce the voltage level of Vregister 720. Reducing the voltage level of Vregister 720 may make it easier for write bit line 711 to turn Q705 on through n-channel transistor Q701, since the voltage level from p-channel transistor Q703 may be lowered due to the "weakened" Vregister 720. Since the voltage level from Q703, which may currently be on, is the signal responsible for turning Q705 off and Q706 on, the easier it is for write bit line 711 to overpower Q703 and bring the node data 730 low, the more likely the cross-coupled inverters are to swap states, thereby storing a "0" now instead of a "1." Once the write phase is over, Vregister may be decoupled or the voltage reduction circuit may be deactivated and Vregister may return to a normal supply voltage. Write word line 710 may go low and Q701 and Q702 may turn off. Memory cell 700 may now store the new data value and may be read in a future read operation.

It is noted that FIG. 7 is merely an example. Although the transistors are depicted as being MOSFETs, in other embodiments, any suitable transconductance devices, such as, e.g., JFETs, may be employed. Other embodiments may include different numbers of transistors, and the addition of passive components, such as capacitors, for example. Different configurations of the transistors are possible and contemplated.

Figure 8:
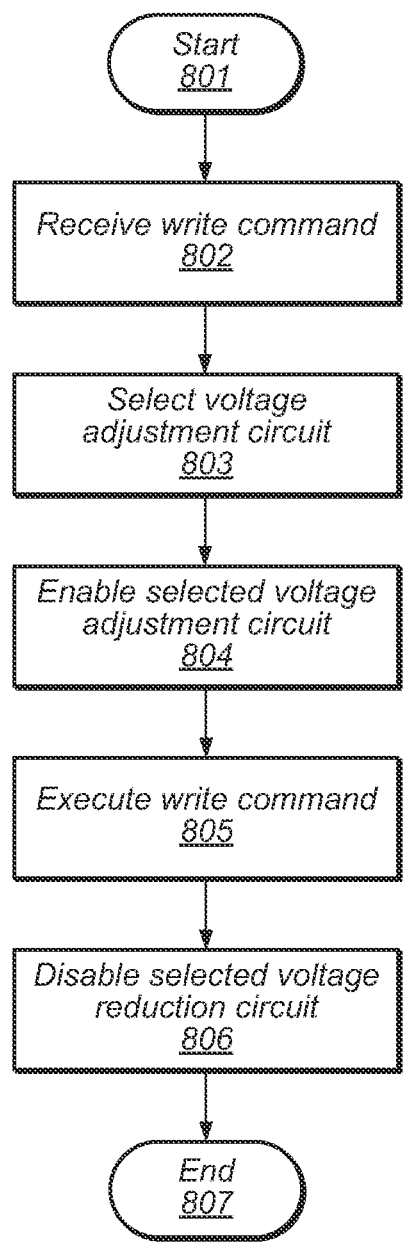
FIG. 8 illustrates a flowchart for a method for writing data in a memory cell.

Moving on to FIG. 8, a flowchart for a method for writing data into a memory cell is illustrated. The method of FIG. 8 may be applied to memory system 300 of FIG. 3. Referring collectively to FIG. 3 and the flowchart of FIG. 8, the method may begin in block 801.

Control circuit 307 may receive a command to write data to register file 301 (block 802). In some embodiments, an address may be received along with the write command. In other embodiments, the destination address may be a next available memory location such as, for example, in a first-in-first-out (FIFO) queue. The write command may be directed towards one or more register memories 302 in register file 301.

Control circuit 307 may select a voltage adjustment circuit for use during the execution of the write command (block 803). In order to improve the write capability of register file 301, a suitable voltage adjustment circuit 303 may be selected and enabled. In some embodiments, the suitable voltage adjustment circuit 303 may be selected before the write command is received. In such embodiments, one of the voltage adjustment circuits 303 may selected periodically or one may be selected in response to an event other than the reception of a write command to register file 301. In other embodiments, the selection may be made after the reception of the write command.

Selecting a suitable voltage adjustment circuit 303 may include making a selection dependent upon one or more operating conditions. Examples of operating conditions may include a current voltage level of a power supply, a recent temperature measurement, a level of activity of adjacent circuits, a noise level on a power supply and/or ground reference used by register file 301, error rates associated with each of the voltage adjustment circuits, and the destination address of the write command.

In some embodiments, selection of a suitable voltage adjustment circuit 303 may also occur during a test procedure of a system. A test may indicate a preferable performance of one or more voltage adjustment circuits 303. Test results may be saved in the system and these results may be used as a condition for selecting a voltage adjustment circuit or in other embodiments, the test results alone may determine the selection.

Once a suitable voltage adjustment circuit 303 has been selected, control circuit 307 may enable the circuit (block 804). Enabling the circuit may include enabling a switch to couple an output of the selected voltage adjustment circuit 303 to the one or more register memories 302. In other embodiments, enabling the circuit may include asserting a signal to start the voltage adjustment process.

Once the selected voltage reduction circuit 303 has been enabled, the write command may be executed (block 805). Execution of the write command may include the assertion of a write word line coupled to one or more destination memory cells, such as, for example, write word line 710 in FIG. 7. The write command may conclude after a single assertion of the write word line, or in some embodiments, one write command may include assertion of multiple write word lines to write to multiple register memories 302.

Once the last register memory 302 from the current write command has been written, the selected voltage adjustment circuit 303 may be disabled (block 806). Disabling the selected voltage adjustment circuit 303 may include de-asserting an enable signal to stop the voltage adjustment process. Disabling the circuit may also include disabling a switch to decouple the selected voltage adjustment circuit 303 from the one or more register memories 302. Stopping the voltage adjustment process and/or decoupling the selected voltage adjustment circuit 303 from the register memories 302 may include placing the output of the selected voltage adjustment circuit 303 in a high resistance floating state which may allow for a different voltage adjustment circuit 303 to be selected for the next write operation. Once the selected voltage adjustment circuit 303 has been disabled, the method may end in block 807.

It is noted that the method of FIG. 8 is merely an example. In other embodiments, different operations and different orders of operations are possible and contemplated.

Figure 9:
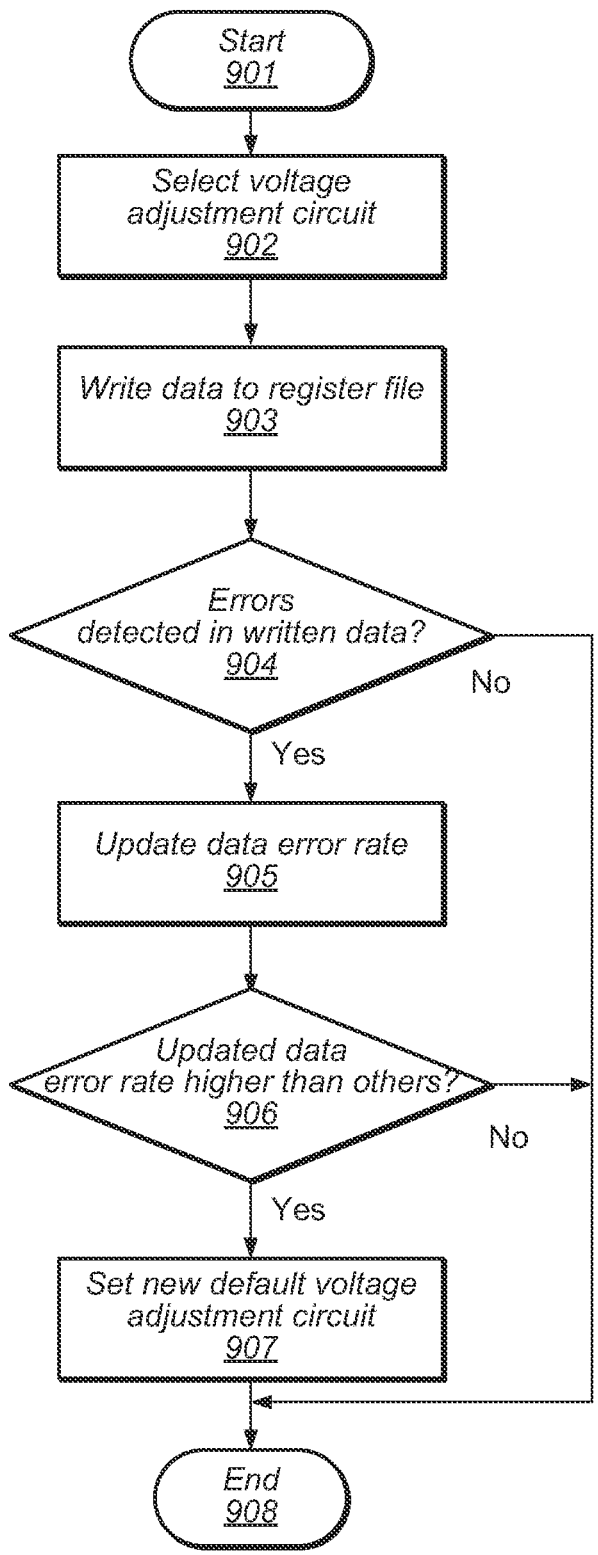
FIG. 9 illustrates a flowchart for a method for tracking write errors in a memory.

Turning now to FIG. 9, a flowchart for a method for tracking write errors in a memory is presented. The method of FIG. 9 may be applied to memory system 300 of FIG. 3. Referring collectively to FIG. 3 and the flowchart of FIG. 9, the method may begin in block 901.

Control circuit 307 may select a suitable voltage adjustment circuit 303 (block 902). The selection process may be similar as described above for block 803 in FIG. 8. An error rate may be one of the operating conditions used to select the suitable voltage adjustment circuit 303. Once a suitable voltage adjustment circuit 303 has been selected, it may be enabled in a similar fashion as described above for block 804 in FIG. 8. In some embodiments, the selection may occur before a memory access command is received and then the suitable voltage adjustment circuit 303 may be enabled after the memory access command has been received. In other embodiments, the selection and enabling of the suitable voltage adjustment circuit 303 may both occur after a memory access command has been received.

Control circuit 307 may execute a write command after a suitable voltage adjustment circuit 303 has been selected and enabled (block 903). The write command may include a signal register memory 302 or may include multiple register memories 302 and may require several write operations to complete the write command. As part of the write command, the register memories that have been written may be read to determine if any data errors resulted from the write command.

The method may now depend upon a number of errors detected from the write command (block 904). Control circuit 307 may read each memory register 302 that has been written by the current write command to determine if the stored data values match the data values received as part of the write command. Control circuit 307 may increment an error count for each incorrect value read from a memory cell. In other embodiments, the error count may be incremented once for each register memory 302 with one or more data bit errors. In alternative embodiments, the error count may be incremented once for one or more data bit errors from each write command, regardless of how many register memories were written by a given command. If no errors were detected from the write command, then the method may end in block 908.

If errors were detected from the write command, then a data error rate may be updated for the selected voltage adjustment circuit (905). Control circuit 307 may track a data error rate for each voltage adjustment circuit in memory system 300. In some embodiments, the data error rate may correspond to a total number of detected errors which may be reset upon reaching a certain threshold number or may be reset in response to an occurrence of an event such as a system reset, a system power cycle or an assertion of a periodic signal. In other embodiments, a ratio or percentage of data errors may be calculated by dividing the total error count by a count of total write operations using the selected voltage adjustment circuit 303. In still other embodiments, the total error count for the selected voltage adjustment circuit may be reset to zero upon executing a threshold number of write commands in succession without a detected data error.

The data error rate, in some embodiments, may be adjusted up or down based on the current operating conditions. For example, if a voltage level of an operating voltage is lower during the most recent write operation than it was for previous write operations, the data error rate may be adjusted lower to compensate for the lower operating voltage. Along the same lines, if data errors are detected for the selected voltage adjustment circuit while operating conditions are favorable, then the data error rate may be increased accordingly.

The method may now depend upon a comparison of the current data error rates (block 906). If the data error rate has been updated for a given voltage adjustment circuit 303, then this data error rate may be compared to the current data error rates of other voltage adjustment circuits 303. If the error rate of the selected voltage adjustment circuit 303 is the lowest, then the method may end in block 908. Otherwise, if one or more data rates for the other voltage adjustment circuits 303 is lower than the just incremented error rate, the method may move to block 907 to select a new default voltage adjustment circuit 303. In some embodiments, this comparison process may occur as part of the selection process in block 902.

If the most recently incremented error rate is not lower than the other tracked error rates, then a new default voltage adjustment circuit 303 may be selected (block 907). The tracked data error rates may be compared to each other and the voltage adjustment circuit 303 with the lowest error rate may be selected as the default. The method may end in block 908.

It is noted that the method represented in FIG. 9 is merely an example for presenting the concepts disclosed herein. In other embodiments, a different number of steps may be included. Steps may also be performed in a different order than illustrated.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a plurality of data storage cells;
   a plurality of voltage reduction circuits, wherein each voltage reduction circuit of the plurality of voltage reduction circuits is configured to reduce a level of a power supply voltage provided to each data storage cell of the plurality of data storage cells; and
   circuitry configured to:
     select one of the plurality of voltage reduction circuits, dependent upon one or more operating parameters;
     activate the selected one of the plurality of voltage reduction circuits dependent upon receiving a write operation to be performed on one or more data storage cells of the plurality of data storage cells;
     execute the write operation; and
     de-activate the selected one of the plurality of voltage reduction circuits responsive to a determination that the write operation has complete;
   wherein the plurality of voltage reduction circuits includes:
     a first voltage reduction circuit including a first transistor coupled between a power supply and a power terminal on each of the plurality of data storage cells, wherein a voltage level of a first control signal coupled to the first transistor is configured to turn the first transistor partially on;
     a second voltage reduction circuit including a second transistor coupled between the power supply and an intermediate node, and a third transistor coupled between the intermediate node and the power terminal on each of the plurality of data storage cells, wherein a control terminal of the second transistor is coupled to a ground reference and a control terminal of the third transistor is coupled to a second control signal; and
     a third voltage reduction circuit configured to decouple the power supply from the power terminal on each data storage cell of the plurality of data storage cells for a duration of the write operation.

2. The apparatus of claim 1, wherein the circuitry is further configured to detect and track data errors associated with the execution of the write operation.

3. The apparatus of claim 2, wherein one of the one or more operating parameters is dependent upon the tracked data errors.

4. The apparatus of claim 1, wherein one of the one or more operating parameters is dependent upon a level of activity of additional circuitry adjacent to the plurality of data storage cells.

5. The apparatus of claim 1, wherein one of the one or more operating parameters is dependent upon a detected temperature.

6. The apparatus of claim 1, wherein the write operation is to be performed on a subset of the plurality of data storage cells, and wherein one of the one or more operating parameters is dependent upon the one or more data storage cells of the plurality of data storage cells.

7. A method for operating a memory, wherein the memory includes a plurality of memory cells, the method comprising:
generating a first voltage level of a plurality of alternative power supply voltage levels, wherein generating the first voltage level of the plurality of alternative power supply voltage levels comprises coupling a first transistor between a power supply and a power terminal on each of the plurality of memory cells, wherein a voltage level of a first control signal coupled to the first transistor is configured to turn the first transistor partially on;
generating a second voltage level of the plurality of alternative power supply voltage levels, wherein generating the second voltage level of the plurality of alternative power supply voltage levels comprises coupling a second transistor between the power supply and an intermediate node, and coupling a third transistor between the intermediate node and the power terminal on each of the plurality of memory cells, wherein a control terminal of the second transistor is coupled to a ground reference and a control terminal of the third transistor is coupled to a second control signal;
generating a third voltage level of the plurality of alternative power supply voltage levels, wherein generating the third voltage level of the plurality of alternative power supply voltage levels comprises decoupling the power supply from the power terminal of each memory cell of the plurality of memory cells for a duration of the operation;
selecting one of the plurality of alternative power supply voltage levels for a level of a power supply voltage provided to each memory cell of the plurality of memory cells dependent upon one or more operating parameters;
receiving a command, wherein the received command includes an operation to be performed on one or more of the plurality of memory cells;
adjusting the level of the power supply voltage provided to each memory cell of the plurality of memory cells from a first voltage level to a second voltage level, wherein the second voltage level is dependent upon the selected one of the plurality of alternative power supply voltage levels;
performing the received operation on the one or more of the plurality of memory cells; and
returning the level of the power supply voltage provided to each memory cell to the first voltage level responsive to determination that the operation has completed.

8. The method of claim 7, further comprising detecting and tracking data errors associated with performing the operation.

9. The method of claim 8, wherein one of the one or more operating parameters is dependent upon the tracked data errors.

10. The method of claim 7, wherein one of the one or more operating parameters is dependent upon a level of activity of circuitry adjacent to the plurality of memory cells.

11. The method of claim 7, wherein one of the one or more operating parameters is dependent upon a detected temperature.

12. The method of claim 7, wherein one of the one or more operating parameters is dependent upon the one or more of the plurality of memory cells.

13. A system, comprising:
a plurality of register files, wherein each register file includes a plurality of registers;
a plurality of power circuits, wherein each power circuit of the plurality of power circuits is coupled to a respective one of the plurality of register files, wherein each power circuit of the plurality of power circuits includes a plurality of voltage reduction circuits, and wherein each voltage reduction circuit of the plurality of voltage reduction circuits is configured to reduce a level of a power supply voltage provided to the plurality of registers in the respective one of the plurality of register files; and
circuitry configured to:
for each power circuit of the plurality of power circuits, select one voltage reduction circuit of the respective plurality of voltage reduction circuits dependent upon one or more operating parameters;
receive a write operation directed towards one or more registers of a given register file of the plurality of register files;
adjust the level of the power supply voltage provided to the given register file dependent upon the selected voltage reduction circuit of the respective power circuit of the plurality of power circuits; and
deactivate the selected voltage reduction circuit of the respective power circuit responsive to a determination that the write operation has completed;
wherein the plurality of voltage reduction circuits of each of the plurality of power circuits includes:
a first voltage reduction circuit including a first transistor coupled between a power supply and a power terminal on each register of the plurality of registers of a respective one of the plurality of register files, wherein a voltage level of a first control signal coupled to the first transistor is configured to turn the first transistor partially on;
a second voltage reduction circuit including a second transistor coupled to the power supply and an intermediate node and a third transistor coupled between the intermediate node and the power terminal on each register of the plurality of registers of the respective one of the plurality of register files, wherein a control terminal of the second transistor is coupled to a ground reference and a control terminal of the third transistor is coupled to a second control signal; and
a third voltage reduction circuit configured to decouple the power supply from the power terminal on each register of the plurality of registers of the respective one of the plurality of register files for a duration of the write operation.

14. The system of claim 13, wherein the given register file is further configured to detect and track data errors associated with the received write operation.

15. The system of claim 14, wherein one of the one or more operating parameters is dependent upon the tracked data errors.

16. The system of claim 13, wherein one of the one or more operating parameters is dependent upon a detected temperature.

17. The system of claim 16, wherein to select one voltage reduction circuit of the respective plurality of voltage reduction circuits for each power circuit of the plurality of power circuits, the circuitry is further configured to:
- select a first voltage reduction circuit of the plurality of voltage reduction circuits of a first one of the plurality of power circuits dependent upon a level of activity of circuits adjacent to a respective first register file; and
- select a second voltage reduction circuit of the plurality of voltage reduction circuits of a second one of the plurality of power circuits dependent upon a level of activity of circuits adjacent to a respective second register file.

18. The apparatus of claim 2, wherein the circuitry is further configured to select a different one of the plurality of voltage reduction circuits in response to a determination that the number of data errors is greater than a threshold.

19. The method of claim 8, further comprising selecting a different one of the plurality of alternative power supply voltage levels in response to a determination that the number of data errors is greater than a threshold.

20. The system of claim 14, wherein, for a given power circuit of the plurality of power circuits, the circuitry is further configured to select a different one of the respective plurality of voltage reduction circuits in response to a determination that the number of data errors in the respective register file is greater than a threshold.

* * * * *